(12) United States Patent
Heberle

(10) Patent No.: US 8,878,524 B2
(45) Date of Patent: Nov. 4, 2014

(54) METHOD FOR DETERMINING A DISTANCE AND AN INTEGRATED MAGNETIC FIELD MEASURING DEVICE

(71) Applicant: Micronas GmbH, Freiburg (DE)

(72) Inventor: Klaus Heberle, Emmendingen (DE)

(73) Assignee: Micronas GmbH, Freiburg (DE)

( * ) Notice: Subject to any disclaimer, the term of this patent is extended or adjusted under 35 U.S.C. 154(b) by 144 days.

(21) Appl. No.: 13/657,156

(22) Filed: Oct. 22, 2012

(65) Prior Publication Data

US 2013/0099777 A1    Apr. 25, 2013

Related U.S. Application Data

(60) Provisional application No. 61/559,286, filed on Nov. 14, 2011.

(30) Foreign Application Priority Data

Oct. 21, 2011   (DE) .......................... 10 2011 116 545

(51) Int. Cl.
| | |
|---|---|
| G01B 7/14 | (2006.01) |
| G01R 29/04 | (2006.01) |
| G01D 5/14 | (2006.01) |
| G01R 33/07 | (2006.01) |
| G01B 7/02 | (2006.01) |
| H01L 43/06 | (2006.01) |

(52) U.S. Cl.
CPC  *G01B 7/14* (2013.01); *G01D 5/145* (2013.01); *G01R 33/07* (2013.01); *G01B 7/023* (2013.01); *H01L 43/065* (2013.01)
USPC ............... 324/207.2; 324/207.12; 324/117 H; 338/32 H

(58) Field of Classification Search
USPC ............ 324/207.2, 207.12, 117 H; 338/32 H
See application file for complete search history.

(56) References Cited

U.S. PATENT DOCUMENTS

| | | | |
|---|---|---|---|
| 4,829,352 A | 5/1989 | Popovic et al. | |
| 5,535,142 A | 7/1996 | Mehnert et al. | |
| 6,472,878 B1 | 10/2002 | Bruchmann | |
| 6,917,193 B1 | 7/2005 | Howard et al. | |
| 8,203,329 B2 | 6/2012 | Hohe et al. | |
| 2005/0286190 A1 | 12/2005 | Rostron et al. | |
| 2007/0229060 A1 | 10/2007 | Taguchi et al. | |

(Continued)

FOREIGN PATENT DOCUMENTS

| | | |
|---|---|---|
| DE | 42 24 225 A1 | 1/1994 |
| DE | 197 41 417 A1 | 4/1999 |
| DE | 199 46 935 A1 | 5/2001 |

(Continued)

*Primary Examiner* — Reena Aurora
(74) *Attorney, Agent, or Firm* — Muncy, Geissler, Olds & Lowe, P.C.

(57) ABSTRACT

An integrated magnetic field measuring device is provided that includes a semiconductor body arranged on a metal substrate and having a first surface, and a plurality of metal surfaces formed on the surface, a first magnetic field sensor, formed in the semiconductor body and having a first sensor signal, and second magnetic field sensor having a second sensor signal, and a current-carrying first conductor. A third magnetic field sensor with a third sensor signal is formed in the semiconductor body. The first magnetic field sensor, the second magnetic field sensor, and the third magnetic field sensor have a substantially identical orientation to Earth's magnetic field and a different distance to the first conductor and the magnetic field of the first conductor simultaneously penetrates the first magnetic field sensor, the second magnetic field sensor, and the third magnetic field sensor.

13 Claims, 3 Drawing Sheets

(56) References Cited

U.S. PATENT DOCUMENTS

| | | |
|---|---|---|
| 2008/0309327 A1 | 12/2008 | Holmstrom |
| 2011/0046906 A1 | 2/2011 | Albertini |
| 2011/0057650 A1 | 3/2011 | Hellwig et al. |
| 2012/0084051 A1 | 4/2012 | Hackner et al. |
| 2013/0024156 A1 | 1/2013 | Servel |

FOREIGN PATENT DOCUMENTS

| | | |
|---|---|---|
| DE | 10 2007 041 230 B3 | 4/2009 |
| EP | 0 244 577 A1 | 11/1987 |
| EP | 0 591 113 A1 | 4/1994 |
| EP | 1 243 891 A2 | 9/2002 |
| EP | 2 256 521 A1 | 12/2010 |
| FR | 2 954 824 A1 | 7/2011 |
| GB | 2 463 701 A | 3/2010 |

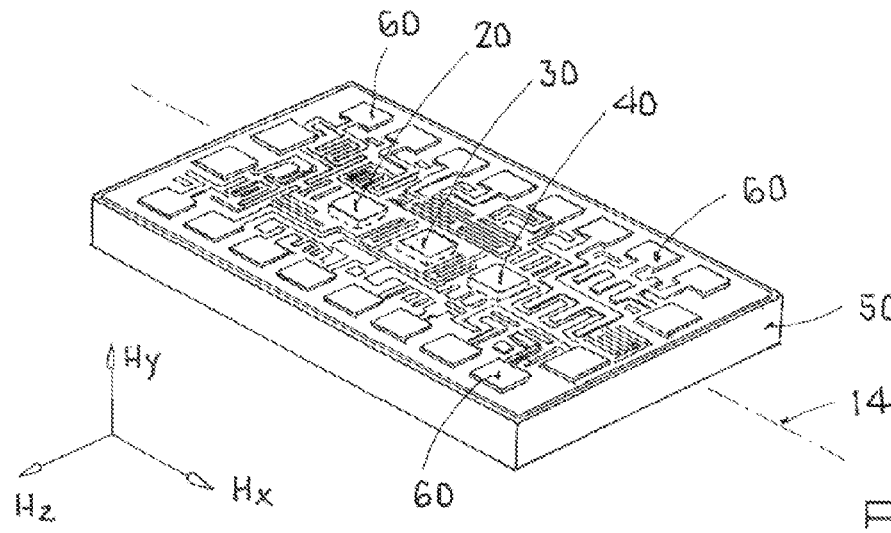
FIG. 4
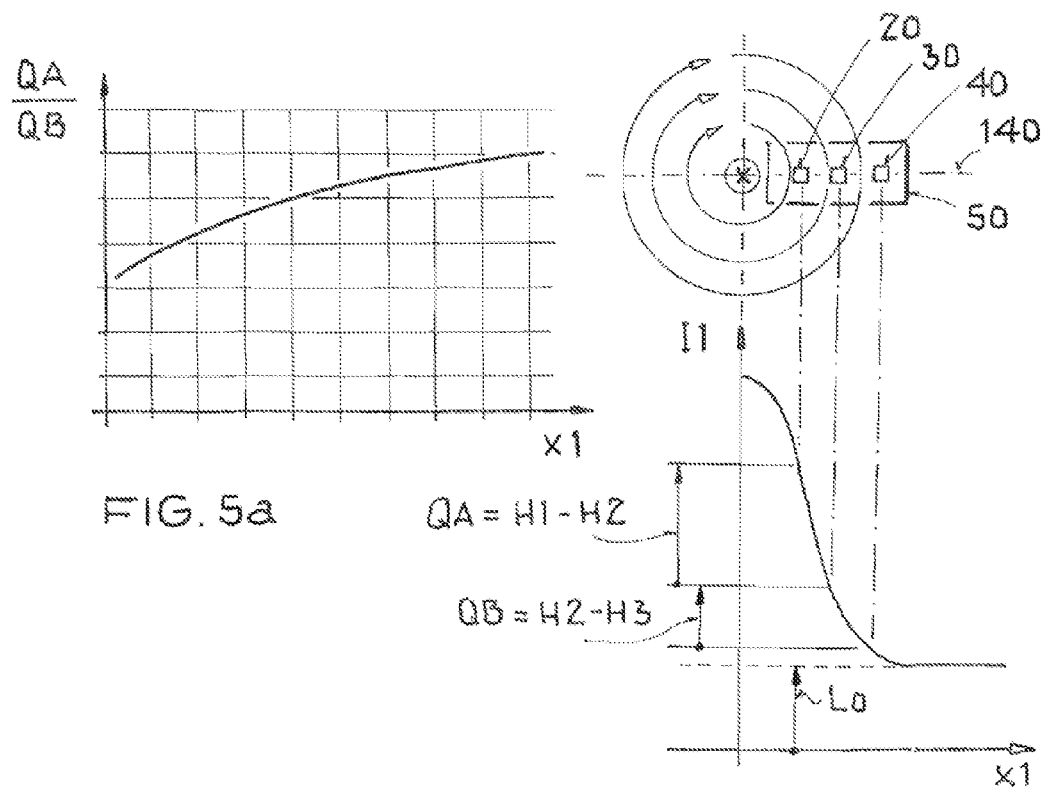
FIG. 5a
$QA = H1 - H2$
$QB = H2 - H3$
FIG. 5b

METHOD FOR DETERMINING A DISTANCE AND AN INTEGRATED MAGNETIC FIELD MEASURING DEVICE

This nonprovisional application claims priority to German Patent Application No. DE 10 2011 116 545.6, which was filed in Germany on Oct. 21, 2011, and to U.S. Provisional Application No. 61/559,286, which was filed on Nov. 14, 2011, and which are both herein incorporated by reference.

BACKGROUND OF THE INVENTION

1. Field of the Invention

The present invention relates to a method for determining a distance and an integrated magnetic field measuring device.

2. Description of the Background Art

Different approaches to the design of a magnetic field measuring device are known from DE 199 46 935 A1, U.S. Pat. No. 6,917,193 B1, US 2007 022 906 0 A1, DE 197 41 417 B4 (which corresponds to U.S. Pat. No. 6,472,878), and DE 10 2007 041 230 B3 (which corresponds to U.S. Pat. No. 8,203,329). Further, US patent publications No. 2011/0046906 A1, No. 2011/0057650 A1, No. 2005/0286190 A1, and No. 2007/0229060 A1 disclose further methods and devices.

SUMMARY OF THE INVENTION

It is therefore an object of the invention to provide a device that refines the conventional art.

According to an embodiment, a method is provided for determining a distance of a current-carrying first conductor by means of an integrated magnetic field measuring device, whereby the integrated magnetic field measuring device has a semiconductor body with a first magnetic field sensor, formed in the semiconductor body, and a second magnetic field sensor and a third magnetic field sensor, whereby a first sensor signal is provided by the first magnetic field sensor and a second sensor signal is provided by the second magnetic field sensor and a third sensor signal is provided by the third magnetic field sensor, and the first magnetic field sensor and the second magnetic field sensor, and the third magnetic field sensor are simultaneously penetrated by the magnetic field of the first conductor and for determining the distance of the magnetic field measuring device from the current-carrying conductor, a first difference is determined from the first sensor signal and the second sensor signal and a second difference from the third and the second sensor signal and then a quotient is formed from the first difference and the second difference.

According to a further embodiment of the invention, an integrated magnetic field measuring device is provided for determining a first distance of the magnetic field measuring device to the current-carrying first conductor, with a semiconductor body, arranged on a metal substrate, and a first magnetic field sensor, formed in the semiconductor body, with a first sensor signal, and second magnetic field sensor, formed in the semiconductor body, with a second sensor signal, and, a third magnetic field sensor, formed in the semiconductor body, with a third sensor signal, whereby the first magnetic field sensor and the second magnetic field sensor, and the third magnetic field sensor have a different distance to the first conductor and the magnetic field of the first conductor simultaneously penetrates the first magnetic field sensor, the second magnetic field sensor, and the third magnetic field sensor, whereby a control unit is formed and set up to determine a first difference from the first sensor signal and the second sensor signal and a second difference from the third sensor signal and the second sensor signal and to form a quotient from the first difference and the second difference and to determine the first distance between the magnetic field measuring device and the first conductor from the quotient.

An advantage of the integrated magnetic field measuring device is that the distance of a current-carrying conductor to the magnetic field sensor as well as information on the distance between the three magnetic field sensor can be determined from the different magnitude of the sensor signals of the individual magnetic field sensors by means of at least three magnetic field sensors. To this end, a difference between the sensor signals is calculated. It is advantageous further that the magnetic field measuring device can be integrated monolithically and cost-effectively without the current-carrying or magnetic field-associated conductors. The magnetic field measuring device can be produced by means of a CMOS process. Studies have shown that the distances of the individual magnetic field sensors to one another can be predefined very accurately during the CMOS production process. The magnetic field sensors can also be oriented very accurately and produced with substantially similar properties.

In an embodiment, the second magnetic field sensor can be spaced apart differently from the first magnetic field sensor and the third magnetic field sensor. In an alternative embodiment, the distance between the first magnetic field sensor and the second magnetic field sensor can be the same as the distance between the second magnetic field sensor and the third magnetic field sensor.

An advantage of the present invention is that the integrated magnetic field measuring device can be used for fading out a superposed magnetic field, whereby the change in the magnetic flux between the first magnetic field sensor and the second magnetic field sensor and the third magnetic field sensor is precisely zero or nearly zero. Such fields can be called DC magnetic fields, or differently stated, the gradient of the field along the spatial arrangement of the magnetic field sensor is substantially zero. In other words, the so-called DC magnetic fields can be faded out in a simple manner by means of the magnetic field sensors of the integrated magnetic field measuring device. Studies have shown, namely, that such DC fields generate substantially the same offset signal in all three magnetic field sensors; i.e., the offset signals can be largely eliminated by means of a subtraction. As a result, the sensitivity of the magnetic field measuring device is increased further.

According to an embodiment, a linearization is performed before the determination of the distance by means of a comparison of the quotient with a value table, so that a proportional dependence results between the determined distance and the quotient. In an alternative embodiment, a distance between the first magnetic field sensor and the second magnetic field sensor and between the second magnetic field sensor and the third magnetic field sensor is changed in such a way that a proportional dependence results between the quotient and the first distance.

According to an embodiment, the first magnetic field sensor, the second magnetic field sensor, and the third magnetic field sensor are arranged substantially or precisely on a straight line and/or in the same plane. An advantage is that the only distance between the three magnetic field sensors along the straight line is to be considered in the calculation of the differential signal.

According to a further embodiment, the first magnetic field sensor, the second magnetic field sensor, and the third magnetic field sensor are connected in series with respect to the operating current. Differences in signal generation of the individual magnetic field sensors by a different current feed can be ruled out as a result. Alternatively, each magnetic field sensor has a current or voltage source.

In an embodiment, the first magnetic field sensor, the second magnetic field sensor, and the third magnetic field sensor are each configured as 3D magnetic field sensors. A 3D magnetic field sensor in the present case is understood to be a magnetic field sensor that measures the magnetic field in three spatial directions. Preferably, this type of magnetic field sensor is made from three magnetic field sensor parts formed substantially orthogonal to one another. An advantage is that the sensitivity of the magnetic field measuring device is independent of the spatial position of the magnetic field measuring device in regard to the spatial position of the current-carrying conductor or of the magnetic field to be measured.

According to an embodiment, the first magnetic field sensor, the second magnetic field sensor, and the third magnetic field sensor are each configured as Hall sensors. Such Hall sensors can be produced cost-effectively and reliably within a semiconductor production process and particularly within a CMOS process.

In a further embodiment, a control unit is provided for detecting and evaluating the sensor signals, whereby the control unit is configured and set up to determine a first difference from the first sensor signal and the second sensor signal and a second difference from the third and the second sensor signal. Further, the control unit is configured and set up to form a quotient from the first difference of two sensor signals and the second difference from two sensor signals and to determine the distance of the magnetic field measuring device to the current-carrying conductor from a comparison of the quotients with a predetermined value.

In a further embodiment, an integrated circuit is provided in the semiconductor body, whereby the integrated circuit comprises a current source and an evaluation circuit and/or a control unit, whereby the integrated circuit has an electrical operative connection to the magnetic field sensors, i.e., the magnetic field sensors and the control unit are integrated monolithically into the semiconductor body. It is understood that the integrated circuit is connected to metal surfaces, the so-called pads, by means of traces formed below a passivation layer. The metal surfaces are connected by means of bond wires to terminal contacts, the so-called pins. Preferably, the semiconductor body is connected to the metal substrate and embedded in a housing preferably made of plastic; i.e., the magnetic field measuring device is monolithically integrated.

Studies have shown that the integrated magnetic field measuring device can be used to detect changes in distance between a current-carrying conductor and the magnetic field sensors. It is understood that instead of a current-carrying conductor also the distance to any body can be determined, provided the body is surrounded by a magnetic field having a spatial gradient.

The integrated magnetic field measuring device can be used for a compensation of the distance between the current-carrying conductor or a magnetic field-associated body and the magnetic field sensors, in that the distance between the magnetic field-associated body and the magnetic field measuring device is kept constant by means of a proximity control. Such an electronic control circuit can be integrated readily into the semiconductor body, particularly as another circuit part of the integrated circuit.

The integrated magnetic field measuring device can be used for compensating the deviation of the distance between the current-carrying conductor and the magnetic field sensors from a setpoint value. As a result, the current flowing through the conductor can be determined precisely from the measurement of the magnetic field strength and the distance between the conductor and magnetic field sensors.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 4 shows a perspective view of a semiconductor body with an integrated circuit;

FIGS. 5a, 5b show a schematized illustration of a difference quotient as a function of the distance to a conductor and the course of the signal intensity of a magnetic field sensor as a function of the distance to the conductor.

DETAILED DESCRIPTION

Figure 1:
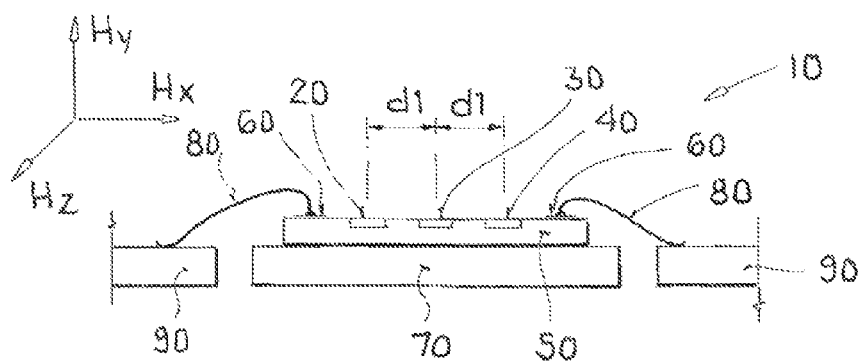
FIG. 1 shows a cross section of a first embodiment.

The illustration in FIG. 1 shows an embodiment of an integrated magnetic field measuring device 10 with a first magnetic field sensor 20, a second magnetic field sensor 30, and a third magnetic field sensor 40. Magnetic field sensors 20, 30 and 40 in the present case for reasons of simplicity are made as 1-dimensional sensors, preferably as 1-dimensional Hall sensors, and configured in a semiconductor body 50. Semiconductor body 50 has a first surface. A plurality of metal surfaces 60, so-called pads, are arranged on the first surface of semiconductor body 50. Semiconductor body 50 is arranged on a metal substrate 70 and preferably connected by material bonding to the metal substrate. Further, metal surfaces 60 are connected by means of bond wires 80 to terminal contacts 90. The terminal contacts are also called pins. A coordinate system with a first magnetic field component Hx, with a second magnetic field component Hy, and a third magnetic field component Hz is drawn in by way of illustration. For the sake of clarity, a housing designed around the components listed above is not shown.

A first distance d1 is formed between first magnetic field sensor 20 and second magnetic field sensor 30. The first distance d1 is also formed between second magnetic field sensor 30 and third magnetic field sensor 40; i.e., second magnetic field sensor 30 is spaced the same distance away from first magnetic field sensor 20 as from third magnetic field sensor 40. Further, magnetic field sensors 20, 30, and 40 are oriented identically in regard to the direction of an external magnetic field, particularly with respect to the Earth's magnetic field. Accordingly, magnetic field sensors 20, 30, and 40 are formed parallel to a plane, spanned by both magnetic field directions Hx and Hz, so that a magnetic field along the Hy direction, when the magnetic field sensors are realized as one-dimensional Hall sensors, results in a Hall voltage UHall.

In an alternative embodiment (not shown), magnetic field sensors 20, 30, and 40 are made as 3-dimensional magnetic field sensors or as 3-dimensional Hall sensors, so that each of the magnetic field sensors or the Hall sensors detects both magnetic field component Hx and magnetic field component Hy, as well as magnetic field component Hz.

If a magnetic field applied between the individual magnetic field sensors 20, 30, and 40 has a gradient along the detection direction of magnetic field sensors 20, 30, and 40, as, for example, the magnetic field of a current-carrying first conductor (not shown), then a first sensor signal of first magnetic field sensor 20 has a different signal level in comparison with a second sensor signal of second magnetic field sensor 30.

Further, the second sensor signal of second magnetic field sensor 30 has a different signal level in comparison with a third sensor signal of third magnetic field sensor 40. The distance of magnetic field sensors 20, 30, and 40 and thereby the distance of integrated magnetic field measuring device 10 to the current-carrying first conductor can be determined in conjunction with the predetermined first distance d1 between magnetic field sensors 20, 30, and 40 through the formation of difference quotients of the different sensor signal levels. More specifically stated, a first difference is determined from a subtraction from the first sensor signal and the second sensor signal, and a second difference is determined from a subtraction from the third and second sensor signal. After this, the distance to the current-carrying conductor is determined from the difference quotients from the first difference and the second difference. Further, a superposed DC magnetic field, for example, such as the Earth's magnetic field, is almost completely eliminated by means of the subtraction or during the determination of the gradients.

Figure 2:
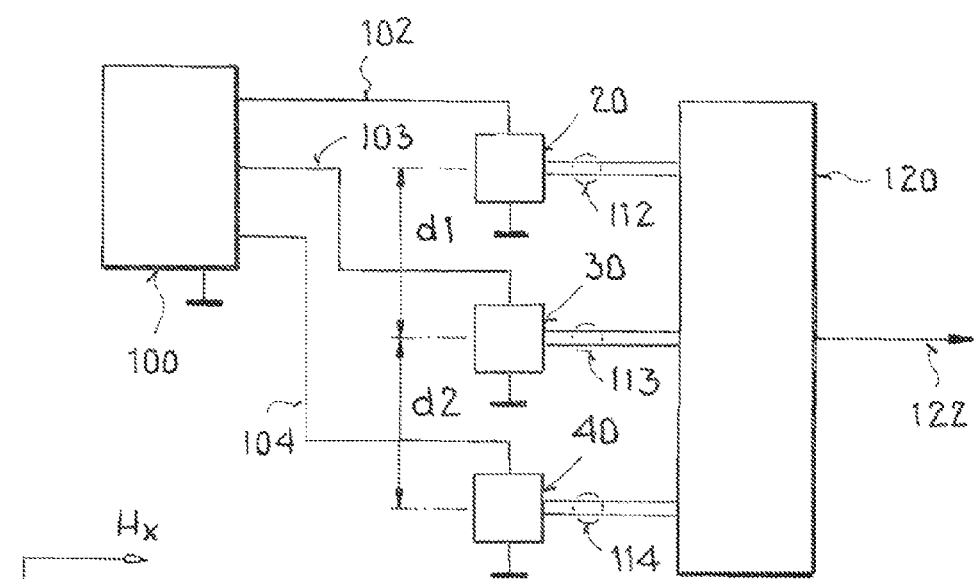
FIG. 2 shows a circuit arrangement of the embodiment of the invention.

A part of a highly simplified circuit arrangement of integrated magnetic field measuring device 10 is shown in FIG. 2. Only the differences relative to the embodiment in FIG. 1 will be described below. First magnetic field sensor 20 is supplied with an operating current or a supply voltage by means of a first line 102, second magnetic field sensor 30 by means of a second line 103, and third magnetic field sensor 40 by means of a third line 104 from a current source 100, as part of an integrated circuit, which is not shown in greater detail. First magnetic field sensor 20 is connected electrically to an evaluation circuit 120 by means of a first connection 112, second magnetic field sensor 30 is connected by means of a second connection 113, and third magnetic field sensor 40 is connected by means of a third connection 114. It should be noted that first connection 112, second connection 113, and third connection 114 in the present case are each made as a so-called "two-wire connection" and that when magnetic field sensors 20, 30, and 40 are realized as Hall sensors, the particular Hall voltage of the Hall sensors is evaluated by evaluation circuit 120 by means of the particular two-wire connection. Alternatively, other one-wire or multiwire connections can also be used. An analog or digital signal is provided by evaluation circuit 120 at an output 122. Preferably, the signal at output 122 is proportional to the determined distance between magnetic field measuring device 120 and the first conductor. In contrast to the embodiment in FIG. 1, a second distance d2 is formed between second magnetic field sensor 30 and third magnetic field sensor 40. The second distance d2 is made different from the first distance d1.

Figures 3A, 3B:
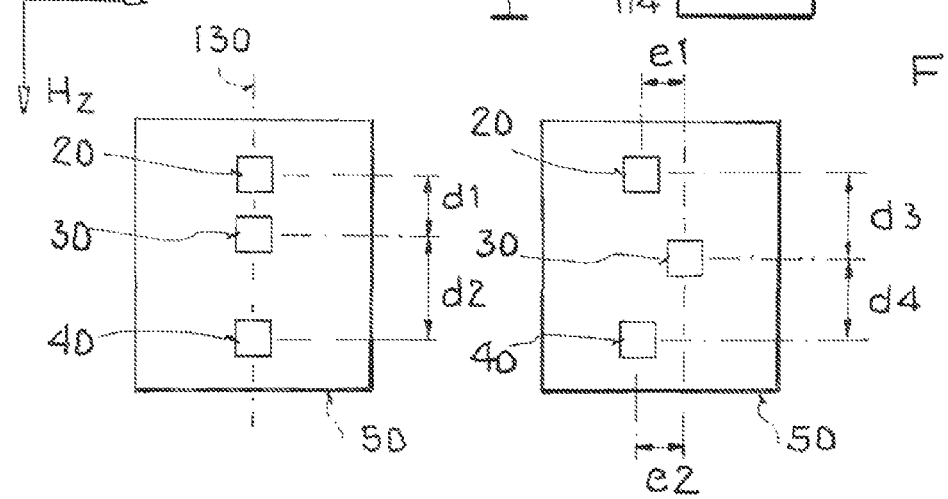
FIGS. 3a, 3b show an enlarged detail illustration of alternative geometric arrangements of the three magnetic field sensors.

An enlarged detail illustration as a plan view of different alternative geometric arrangements of the three magnetic field sensors 20, 30, and 40 is shown in FIGS. 3a and 3b. Only the differences relative to the embodiments of the previous figures will be explained below. In the illustration of FIG. 3a all three magnetic field sensors 20, 30, and 40 lie in a plane spanned by the magnetic field directions Hx, Hz and along a first straight line 130, whereby the first distance d1 is made smaller than the second distance d2. In fact, in FIG. 3b likewise all magnetic field sensors lie in a plane, but first magnetic field sensor 20 is offset laterally to second magnetic field sensor 30 by a first interval e1 and third magnetic field sensor 40 laterally relative to second magnetic field sensor 30 by a second interval e2. According to an alternative embodiment, which is not shown, both intervals e1 and e2 are the same. Further, a third distance d3 is formed along the direction Hz between first magnetic field sensor 20 and second magnetic field sensor 30 and a fourth distance d4 between second magnetic field sensor 30 and third magnetic field sensor 40. According to an alternative embodiment, which is not shown, the third distance d3 is identical to the fourth distance d4.

A perspective view of a semiconductor body with an integrated circuit is shown in FIG. 4. Only the differences relative to the embodiments of the previous figures will be explained below. The three magnetic field sensors 20, 30, and 40 are arranged along a second straight line 140 and surrounded by an integrated circuit. The integrated circuit comprises, among others, evaluation circuit 120 and current source 110. For reasons of clarity, metal substrate 90 and the electrical connections from metal surfaces 60 by means of bond wires 80 and the formed housing are not illustrated.

A schematized illustration of a difference quotient Q as a function of a distance X1 to a magnetic field-associated, i.e., current-carrying conductor is shown in FIG. 5a, and the course of the signal intensity 11 of magnetic field sensors 20, 30, and 40 as a function of the distance X1 to the magnetic field-associated conductor in FIG. 5b. Only the differences relative to the embodiments of the previous figures will be explained below. It becomes apparent in the illustration in FIG. 5a that the distance X1 of magnetic field measuring device 10 to the magnetic field-associated conductor can be easily determined by means of the three magnetic field sensors 20, 30, and 40 and a defined and known distance Dx of magnetic field sensors 20, 30, and 40 to one another. It should be noted that a proportional dependence between the difference quotient QA/QB and the distance X1 can become established by a correction table or by a changed distance Dx between magnetic field sensors 20, 30, and 40.

Magnetic field sensors 20, 30, and 40 arranged on a straight line in the magnetic field of the current-carrying conductor are shown in the top part of FIG. 5b. In correspondence hereto, the functional course of a signal intensity 11 is shown as a function of the distance X1 in the bottom part of FIG. 5b. It becomes apparent that each of the three magnetic field sensors 20, 30, and 40 has a constant external field portion L0 of a spatially constant magnetic field at the measured signal intensity 11. Further, a first difference QA results from the subtraction of the signal intensity H1 of first magnetic field sensor 20 from the signal intensity H2 of second magnetic field sensor 30 and a second difference QB from the subtraction of the signal intensity H2 of second magnetic field sensor 30 from the signal intensity H3 of third magnetic field sensor 40. It becomes evident further that the external field portion L0 disappears with the subtraction.

Figure 6:
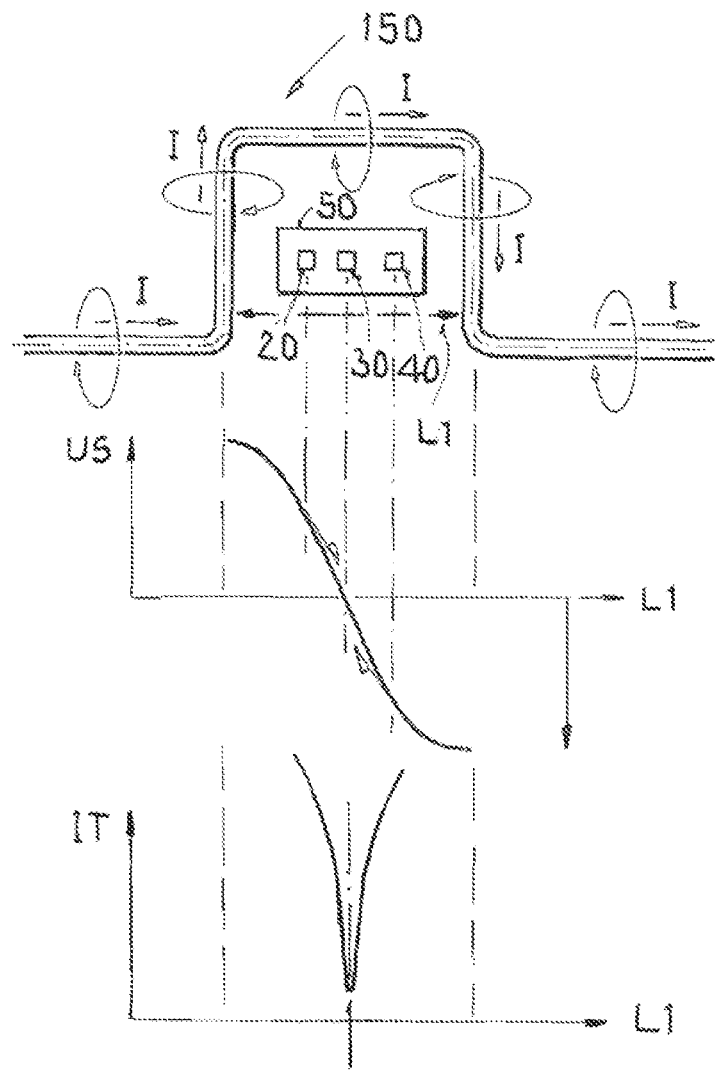
FIG. 6 shows a schematized illustration of the direction and magnitude of a Hall voltage and an intensity as a function of Hall elements for a current-carrying conductor loop.

FIG. 6 shows a further use of measuring field device 10 of the invention. Only the differences relative to the embodiments of the previous figures will be explained below. A conductor loop 150, in which a current I flows, is formed in the top part of FIG. 6. Magnetic field measuring device 10, highly simplified in the form of magnetic field sensors 20, 30, and 40 arranged on a straight line, is arranged between the two ends, i.e., in the clear loop width L1 of conductor loop 150.

In correspondence hereto, the functional course of the direction and magnitude of a Hall voltage US for magnetic field sensors 20, 30, and 40, configured as Hall elements, as a function of a clear loop width L1 of conductor loop 150 is shown in the middle part of FIG. 6.

In correspondence to the middle part of FIG. 6, the functional association of a Hall signal intensity IT as a function of the clear loop width L1 of conductor loop 150 is shown in the bottom part of FIG. 6. It becomes evident that in a central arrangement of the three magnetic field sensors 20, 30, and 40, first magnetic field sensor 20 and third magnetic field sensor 40 generate more or less the same signal strength, whereas in contrast second magnetic field sensor 30 more or less generates precisely no signal. An advantage is that based on the signal course, in particular of second magnetic field sensor 30, a precise positioning of measuring field device 10 can be achieved.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for determining a distance of a current-carrying first conductor, the method comprising:
   providing an integrated magnetic field measuring device having a semiconductor body with a first magnetic field sensor formed in the semiconductor body, having a second magnetic field sensor; and having a third magnetic field sensor;
   providing a first sensor signal from the first magnetic field sensor;
   providing a second sensor signal form the second magnetic field sensor;
   providing a third sensor signal from the third magnetic field sensor;
   penetrating substantially simultaneously the first magnetic field sensor, the second magnetic field sensor, and the third magnetic field sensor by the magnetic field of the first conductor;
   determining a first difference from the first sensor signal and the second sensor signal;
   determining a second difference from the third and the second sensor signal; and
   forming a quotient from the first difference and the second difference to determine a distance of the magnetic field from the current-carrying conductor.

2. The method according to claim 1, wherein a linearization is performed before the determination of the distance via a comparison of the quotient with a value table such that a proportional dependence results between the determined distance and the quotient.

3. The method according to claim 1, wherein a distance between the first magnetic field sensor and the second magnetic field sensor and between the second magnetic field sensor and the third magnetic field sensor is changed such that a proportional dependence results between the quotient and the first distance.

4. The method according to claim 1, wherein the integrated magnetic field measuring device is configured to detect changes in a distance between a conductor and the first, second and third magnetic field sensors.

5. The method according to claim 1, wherein the integrated magnetic field measuring device is configured to compensate for a deviation of the distance between the conductor and the first, second and third magnetic field sensors from a setpoint value.

6. The method according to claim 1, wherein the integrated magnetic field measuring device is configured to fade out a magnetic field, and wherein a change in a magnetic flux between the first magnetic field sensor and the second magnetic field sensor and the third magnetic field sensor is precisely zero or nearly zero.

7. The method according to claim 1, wherein the integrated magnetic field measuring device is configured to determine a current in a spaced-apart conductor.

8. An integrated magnetic field measuring device for determining a first distance of the magnetic field measuring device to a current-carrying first conductor, the device comprising:
   a semiconductor body arranged on a metal substrate;
   a first magnetic field sensor formed in the semiconductor body, the first magnetic field sensor being providing a first sensor signal;
   a second magnetic field sensor formed in the semiconductor body, the second magnetic field sensor providing a second sensor signal;
   a third magnetic field sensor formed in the semiconductor body, the third magnetic field sensor providing a third sensor signal; and
   a control unit determining a first difference from the first sensor signal and the second sensor signal, determining a second difference from the third sensor signal and the second sensor signal, forming a quotient from the first difference and the second difference, and determining the first distance between the magnetic field measuring device and the first conductor from the quotient,
   wherein the first magnetic field sensor, the second magnetic field sensor, and the third magnetic field sensor have a different distance to the first conductor, and
   wherein the magnetic field of the first conductor substantially simultaneously penetrates the first magnetic field sensor, the second magnetic field sensor, and the third magnetic field sensor.

9. The integrated magnetic field measuring device according to claim 8, wherein the first magnetic field sensor, the second magnetic field sensor, and the third magnetic field sensor are arranged substantially on a straight line.

10. The integrated magnetic field measuring device according to claim 8, wherein the first, second and third magnetic field sensors and the control unit are integrated monolithically into the semiconductor body.

11. The integrated magnetic field measuring device according to claim 8, wherein the first magnetic field sensor, the second magnetic field sensor, and the third magnetic field sensor are each formed as three dimensional magnetic field sensors.

12. The integrated magnetic field measuring device according to claim 8, wherein the first magnetic field sensor, the second magnetic field sensor, and the third magnetic field sensor are each configured as Hall sensors.

13. The integrated magnetic field measuring device according to claim 8, wherein the second magnetic field sensor is spaced apart differently from the first magnetic field sensor and the third magnetic field sensor.

* * * * *